United States Patent [19]

Fujita

[11] Patent Number: 5,361,221
[45] Date of Patent: Nov. 1, 1994

[54] RESIDUE CALCULATION CIRCUIT

[75] Inventor: Tadao Fujita, Kanagawa, Japan

[73] Assignee: Sony Corporation, Tokyo, Japan

[21] Appl. No.: 23,681

[22] Filed: Feb. 26, 1993

[30] Foreign Application Priority Data

Mar. 4, 1992 [JP] Japan .................. 4-047286

[51] Int. Cl.⁵ .......................... G06F 7/38
[52] U.S. Cl. ........................... 364/746
[58] Field of Search ........... 364/746, 724.16, 757; 341/83

[56] References Cited

U.S. PATENT DOCUMENTS 4,007,341 2/1977 Sourgens et al. ............ 364/724.16
4,709,345 11/1987 Vu ........................ 364/746

*Primary Examiner*—Jerry Smith
*Assistant Examiner*—Emmanuel Moise
*Attorney, Agent, or Firm*—William S. Frommer; Alvin Sinderbrand

[57] ABSTRACT

A residue calculation circuit which can achieve increase of the calculation speed and reduction of the scale of an integrated circuit. The residue calculation circuit includes cascade-connected delay circuits, a first stage multiplier and a plurality of multipliers for multiplying an input residue and outputs of the delay circuits by respective coefficients and adding a predetermined correction number to residues of the products, a first adder for adding outputs of the first stage multiplier and a first one of the multipliers and outputting a first stage sum data and a first stage carry signal, a plurality of adders each for adding the output of the first adder or one of the adders at a preceding stage and the output of the corresponding multiplier and outputting a sum data and a carry signal, an accumulation circuit for accumulating reversed values of the carry signals and outputting cumulative data, and a correction circuit for multiplying the cumulative data by the predetermined correction number, subtracting thus obtained cumulative correction data from the sum data outputted from the last stage adder and outputting the resulted data as an output of the residue calculation circuit.

3 Claims, 4 Drawing Sheets

RESIDUE CALCULATION CIRCUIT

BACKGROUND OF THE INVENTION

1. Field of the Invention

This invention relates to a residue calculation circuit suitable for use, for example, with a rate conversion apparatus for converting a PAL signal of the D-1 format into another PAL signal of the D-2 format.

2. Description of the Related Art

A residue number system (RNS) is first described prior to description of conventional residue calculation circuits. The residue number system represents, in order to represent a numerical value, a set of residue numbers which do not have a common measure and accordingly are prime relative to each other, and since it treats numerical values as integral numbers, it allows addition, subtraction and multiplication but does not allow division.

A residue number system when the residue numbers are 3, 5 and 7 is described. Since $3 \times 5 \times 7 = 105$ (dynamic range), any one of the numerical values from 0 to 104 at the greatest can be represented by a combination of the residue numbers.

Since $6 = 0 + 3 \times 2 = 1 + 5 \times 1 = 6 + 7 \times 0$, the numerical value 6 is represented as (0, 1, 6) with regard to the residue numbers 3, 5 and 7.

Subsequently, addition, subtraction and multiplication between 4 and 6 will be described.

First, addition will be described. Since $4 = (1, 4, 4)$ and $6 = (0, 1, 6)$, $$(1, 4, 4) + (0, 1, 6) = (1, 0, 3) \tag{1}$$

The equation (1) stands since $1 + 0 = 1 + 3 \times 0$, $4 + 1 = 0 + 5 \times 1$, and $4 + 6 = 3 + 7 \times 1$. Further, since $10 = 1 + 3 \times 3 = 0 + 5 \times 2 = 3 + 7 \times 1$ (1, 0, 3) represents 10, and the equation (1) above represents that $4 + 6 = 10$.

Subsequently, subtraction will be described.

$$(1, 4, 4) - (0, 1, 6) = (1, 3, 5) \tag{2}$$

The equation (2) stands since $1 - 0 = 1 + 3 \times 0$, $4 - 1 = 3 + 5 \times 0$, and $4 - 6 = 5 - 7 \times 1$. Further, since $-2 = 1 - 3 \times 1 = 3 - 5 \times 1 = 5 - 7 \times 1$ (1, 3, 5) represents $-2$, and the equation (2) above represents that $4 - 6 = -2$. Further, since $103 = 1 + 3 \times 34 = 3 + 5 \times 20 = 5 + 7 \times 14$  $-2 = 103$. Further, $0 = 105$ and $-1 = 104$. This can apparently be seen from FIG. 2. In particular, while the numerical value increases in the clockwise direction like 1, 2, 3, . . . , it decreases in the counterclockwise direction like $-1, -2, -3, \ldots$. Whether the clockwise direction is used or the counterclockwise direction is used depends upon setting by a designer.

Subsequently, multiplication will be described.

$$(1, 4, 4) \times (0, 1, 6) = (0, 4, 3) \tag{3}$$

The equation (3) stands since $1 \times 0 = 0 + 3 \times 0$, $4 \times 1 = 4 + 5 \times 1$, and $4 \times 6 = 3 + 7 \times 3$. Further, since $24 = 0 + 3 \times 8 = 4 + 5 \times 4 = 3 + 7 \times 3$ (0, 4, 3) represents 24, and the equation (3) above represents that $4 \times 6 = 24$.

It is to be noted that, in order to return the notation of a numerical value from the residue number notation to the binary notation, a method called Chinese remainder theorem has been used for a long time and is used at present.

With the residue number system, since actual calculation is performed for each residue number, a numerical value for a subject of calculation remains within a comparatively small range in value, and accordingly, there is an advantage in that the restriction in operation speed of an electronic circuit necessary for calculation of a comparatively large value can be moderated significantly.

While the residue number system has the advantage just described, conventional residue calculation circuits employ a method which makes use of a lookup table provided in a ROM in order to calculate residues with respect to specific residue numbers (3, 5 and 7 in the example described above) as a result of calculation. An exemplary one of conventional residue calculation circuits will be described below with reference to FIGS. 3 to 5.

Referring first to FIG. 3, there is shown a rate conversion apparatus for converting a PAL signal of the D-1 format into another PAL signal of the D-2 format. A PAL signal D-1PAL of the D-1 format inputted to a D-1 encoder 1 is separated into a brightness signal Y of the sampling frequency of 13.5 MHz and a pair of color difference signals B-Y and R-Y of the sampling frequency of 6.75 MHz. The brightness signal Y is inputted to a rate conversion circuit 2 while the color difference signals B-Y and R-Y are inputted to a matrix circuit 3. The brightness signal Y is converted into another brightness signal Y' of the sampling frequency of 17.73 MHz by the rate conversion circuit 2. The color difference signals B-Y and R-Y are axially converted into color signals u and v, respectively, by the matrix circuit 3. The color signals u and v are converted into color signals u' and v' of the sampling frequency of 8.87 MHz by a pair of rate conversion circuits 4 and 5, respectively, and then modulated with a subcarrier of 4.43 MHz into a chroma signal CR by a chroma modulation circuit 6. The chroma signal CR and the brightness signal Y' are added by an addition circuit 7 and outputted from the addition circuit 7 as a PAL signal D-2PAL of the D-2 format.

FIG. 4 shows details of the rate conversion circuits 2, 4 and 5 of FIG. 3. Referring to FIG. 4, a signal a (brightness signal Y or color signal u or v) inputted to the rate conversion circuit 2, 4 or 5 shown is separated into residues x, y and z with regard to specific residue numbers, for example, 3, 5 and 7, and the residues x, y and z are inputted to rate converters $9a$, $9b$ and $9c$, respectively. Residues x', y' and z' with regard to 3, 5 and 7 after the rate conversion are composed by a decoder 10 and outputted from the decoder 10 as a signal b (brightness signal Y' or color signal u' OF v').

FIG. 5 shows details of the rate converters $9a$, $9b$ and $9c$ which include a FIR filter as a conventional residue calculation circuit. A portion of the FIR filter except a FIFO (first-in first-out) circuit 21 makes a conventional FIR filter. Referring to FIG. 5, the FIR filter shown includes, in addition to the FIFO circuit 21, three delay circuits 11 to 13 which may be D-type flip-flops. The delay time $\tau$ of the delay circuits 11 to 13 is set to 1/13.5 MHz for the rate conversion circuit 2 and to 1/6.75 MHz for the rate conversion circuits 4 and 5.

The FIR filter further includes four multipliers 14 to 17, which provide outputs An (n=0 to 3) given by $$An = (Kn \times Sn) \bmod R \tag{4}$$

where (Kn×Sn) mod R represents a residue of a result of the multiplication of (Kn×Sn) with regard to the residue number R. For example, when R=31 and (Kn×Sn)=15, An=15, and if (Kn×Sn)=40, then An=40−31=9. The multipliers 14 to 17 may be lookup tables provided by a ROM.

The FIR filter further includes three adders 18 to 20, which may be lookup tables provided by a ROM, similarly to the multipliers 14 to 17.

Output values of the adders 18 to 20 when the residue number R=31, A0=5, A1=25, A2=3 and A3=10 will be described subsequently with reference to FIG. 5. First, the adder 18 calculates A0+A1=30 and outputs the residue 30 (=30+0×31) with regard to the residue number R as a numerical value B1. Then, the adder 19 calculates B1+A2=33 and outputs the residue 2 (33=2+1×31) with regard to the residue number R as a numerical value B2. Finally, the adder 20 calculates B2+A3=12 and outputs the residue 12 with regard to the residue number R as a numerical value B3. The FIFO circuit 21 converts, when the rate conversion circuit is for the brightness signal Y, the residue B3 of the sampling frequency of 13.5 MHz into another residue Sout of the sampling frequency of 17.73 MHz by rate conversion, but converts, when the rate conversion circuit is for the color signal u or v, the residue B3 of the sampling frequency of 6.75 MHz into another residue Sout of the sampling frequency of 8.87 MHz by rate conversion.

In the FIR filter described above, however, since not only the multipliers 14 to 17 but also the adders 18 to 20 are constituted from a ROM, increase of the calculation speed and reduction of the scale of the FIR filter when it is integrated into an integrated circuit cannot be achieved.

SUMMARY OF THE INVENTION

It is an object of the present invention to provide a residue calculation circuit which can achieve increase of the calculation speed and reduction of the scale of an integrated circuit.

In order to attain the object described above, according to the present invention, there is provided a residue calculation circuit for calculating a residue for input residue data, which comprises a delay means set including n delay means connected in cascade connection to each other and each adapted to delay data inputted thereto by a predetermined time, n being a positive integral number, the delay means set inputting and delaying the input residue data so that the n delay means individually output data delayed by time intervals corresponding to the positions thereof in the delay means set, first stage multiplication means for multiplying the input residue data by a first stage coefficient to obtain a first stage product and outputting a residue of the first stage product with regard to a predetermined residue number, a multiplication means set including n multiplication means for multiplying individual output data of the delay means of the delay means set by n coefficients corresponding to the delay means to obtain n products, adding a predetermined correction value to individual residues of the n products with regard to the predetermined residue number to obtain n correction data and outputting the n correction data, first stage addition means for adding the residue with regard to the predetermined residue number outputted from the first stage multiplication means and the correction data outputted from one of the n multiplication means at a first stage in the multiplication means set in binary notation to obtain first stage sum data and outputting the first stage sum data and a first stage carry signal representative of presence or absence of a carry, an addition means set including n-1 addition means provided corresponding to the n multiplication means except the multiplication means at the first stage in the multiplication means each for adding sum data outputted from the first stage addition means or one of the addition means at a preceding stage and the correction data outputted from the corresponding multiplication means of the multiplication means set to to obtain sum data and outputting the sum data thus obtained and a carry signal representative of presence or absence of a carry, accumulation means for accumulating reversed values of the carry signals outputted from the first stage addition means and the addition means set to obtain cumulative data and outputting the cumulative data, and correction means for multiplying the cumulative data from the accumulation means by the predetermined correction number to obtain cumulative correction data, subtracting the cumulative correction data from the last stage sum data outputted from one of the addition means at the last stage in the addition means set to obtain corrected data and outputting the corrected data.

In the residue calculation circuit, the input residue data is successively delayed by the delay means of the delay means set, and the input residue data and the output data of the delay means are multiplied by the first stage coefficient and the n respective coefficients by the first stage multiplication means and the n multiplication means of the multiplication means set, respectively, to obtain products. The first stage multiplication means and the n multiplication means of the multiplication means set further add the predetermined correction number to individual residues of the products with regard to the predetermined residue number.

At the first stage addition means, the residue with regard to the predetermined residue number outputted from the first stage multiplication means and the correction data outputted from the multiplication means at the first stage in the multiplication means set are added in binary notation, and first stage sum data and a first stage carry signal representative of presence or absence of a carry are outputted. At a first one of the addition means of the addition means set, sum data outputted-from the first stage addition means and the correction data outputted from the second multiplication means which corresponds to the first addition means of the addition means set are added in binary notation, and second stage sum data and a second stage carry signal representative of presence or absence of a carry are outputted. At a second one of the addition means of the addition means set, sum data outputted from the first addition means of the addition means set and the correction data outputted from the third multiplication means which corresponds to the second addition means of the addition means set are added in binary notation, and third stage sum data and a third stage carry signal representative of presence or absence of a carry are outputted. A similar operation is performed at each of the following addition means of the addition means set.

Each of the carry signals outputted from the first stage addition means and the addition means of the addition means set has the value of "1" or "0", and reversed values of the carry signals are accumulated by the accumulation means.

The correction means multiplies the cumulative data from the accumulation means by the predetermined correction number to obtain cumulative correction data, subtracts the cumulative correction data from the last stage sum data outputted from the last stage addition means to obtain corrected data, and outputs the corrected data as output data of the residue calculation circuit.

In this manner, with the residue calculation circuit, a portion of the circuit, which is constituted from a ROM with conventional residue calculation circuits, can be constructed from binary adders by using a predetermined correction number. Consequently, a ROM need not be used for the portion of the circuit. Accordingly, the residue calculation circuit can calculate at a high speed and can be formed in a small scale when it is to be formed into an integrated circuit.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
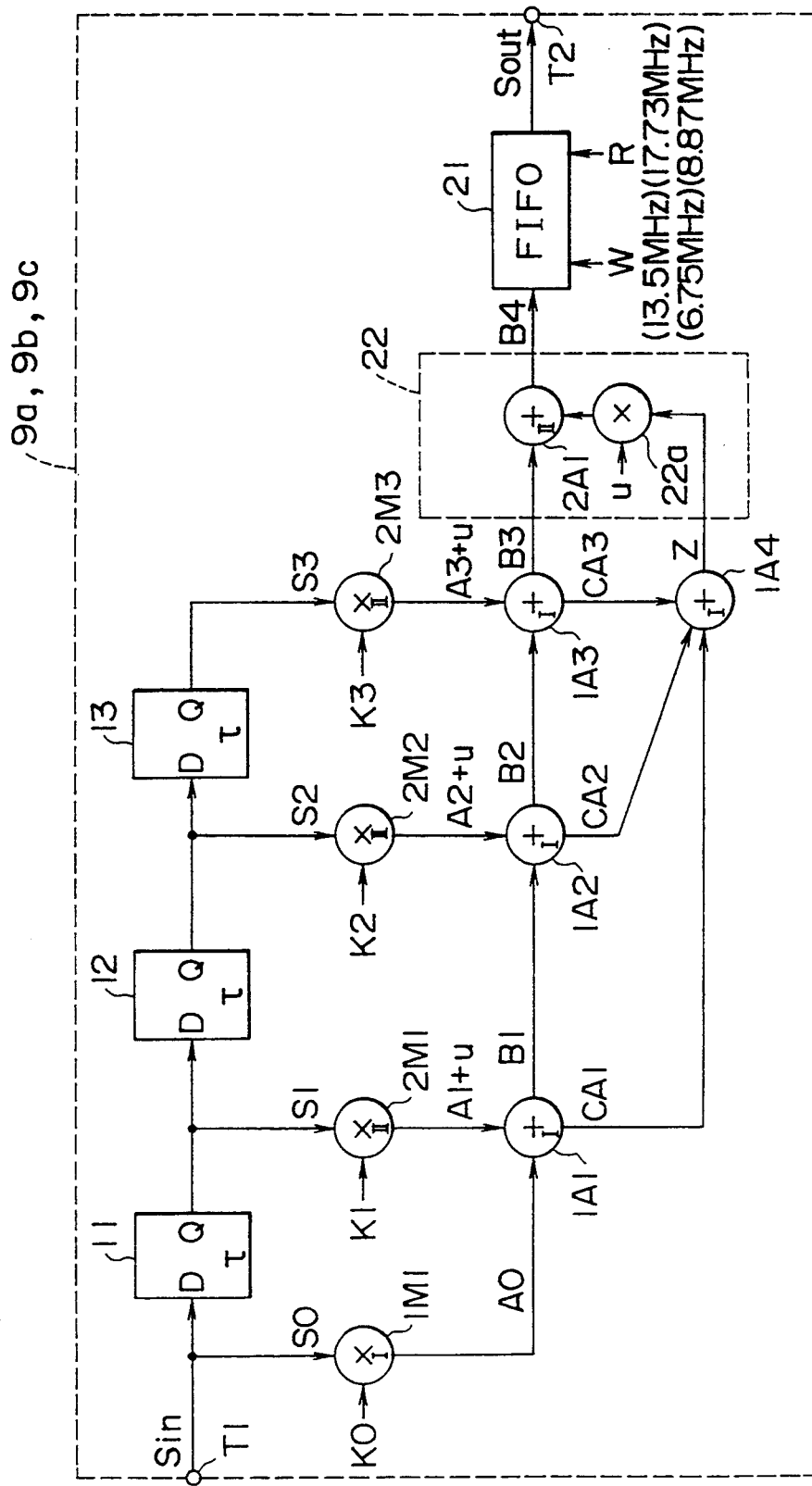
FIG. 1 is a block diagram of a residue calculation circuit showing a preferred embodiment of the present invention.
Figure 2:
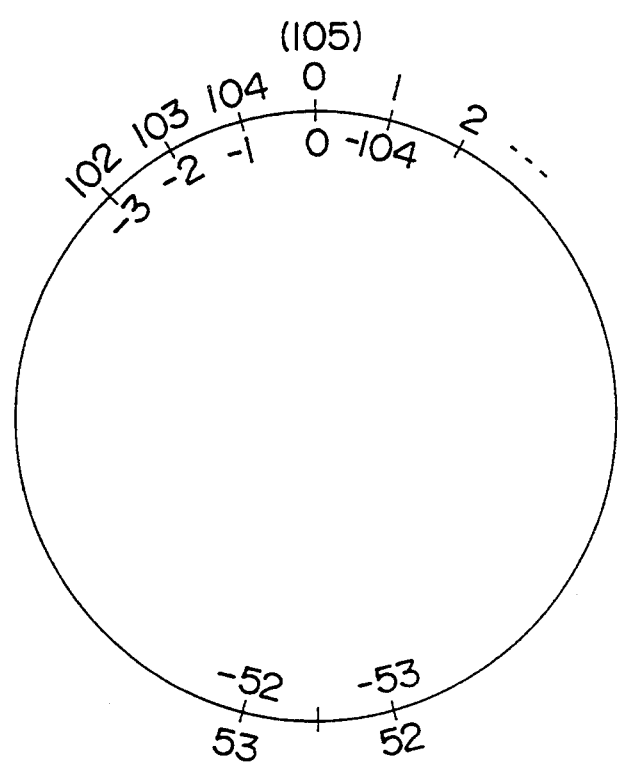
FIG. 2 is a block diagram illustrating a residue number system in the residue calculation circuit of FIG. 1.
Figure 3:
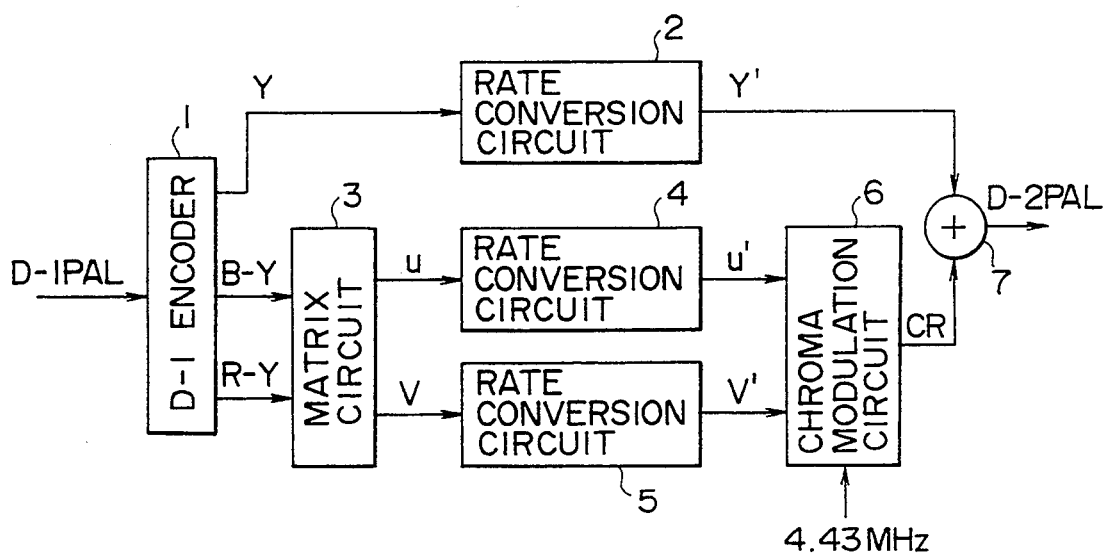
FIG. 3 is a block diagram of a rate conversion apparatus.

Referring first to FIG. 1, there is shown a FIR filter as a preferred embodiment of the present invention. In the present embodiment, adders involved are constituted not from a ROM but from ordinary adders so as to reduce calculation of addition to be performed with a ROM. To this end, a predetermined correction number u is added excessively to effect binary addition, and results of the addition are represented by residues with regard to a maximum number which depends upon the adders and carry signals representative of presence or absence of a carry are produced, and then the values of the carry signals are reversed and added cumulatively to output cumulative data Z. An outline of the calculation method will be described subsequently.

The residue number of the residue calculation circuit is represented by R, and the word length of an adder with which a residue obtained by residue calculation using the residue number is represented by L. Further, the value obtained by addition of 1 to a maximum value of a binary code of the word length L (that is, 2 raised to the Lth power) is represented by M, and $M-R=u$. Multipliers used in the circuit shown in FIG. 1 are separated into two types including the type I and the type II. A multiplier of the type I outputs only a residue of a result of multiplication with regard to the predetermined residue number R while another multiplier of the type II outputs a sum of a residue of a result of multiplication with regard to the predetermined residue number R and the predetermined correction number u.

Also the adders are separated into two types including the type I and the type II, and an adder of the type I outputs a residue with regard to a maximum number which depends upon the adder and a carry signal while another adder of the type II is a subtractor.

In particular, the fact that a carry signal of "1" (a carry bar signal of "0") is produced signifies that the influence of the predetermined correction number u upon a result of addition is eliminated from the relationship $M-R=u$ described above, and the fact that a carry signal of "1" is not produced signifies that the influence of the predetermined correction number u is not eliminated. In order to eliminate the influence of the predetermined correction number u upon a result of addition when no carry signal of "1" is produced, that is, when a carry signal of "0" is produced, the value u x Z is subtracted from a result of addition at an adder of the last stage, where Z is a quantity of carry signals of "0".

Referring now to FIG. 1, input residue data $Sin=S0$ is inputted to an input terminal T1. The thus inputted input residue data $Sin=S0$ is inputted to a first one of delay circuits 11 to 13 constituting a delay means set, that is, the delay circuit 11 and a multiplier 1M1 serving as first stage multiplication means.

The delay circuit 11 delays the input residue data Sin by a predetermined time $\tau$ ($\tau=1/13.5$ MHz for a brightness signal but $\tau=1/6.75$ MHz for a color signal) to produce output data S1 and outputs the output data S1 to the delay circuit 12 and a multiplier 2M1 at a second stage serving as multiplication means at a first stage of a multiplication means set which is constituted from multipliers 2M1 to 2M3. The delay circuit 12 outputs its output data S2 to the delay circuit 13 and the multiplier 2M2 at a third stage. Further, the delay circuit 13 outputs its output data S3 to the multiplier 2M3 at a final stake.

The multiplier 1M1 multiplies the input residue data S0 by a first stage coefficient K0 and outputs a residue A0 of the product of $K0 \times S0$ with regard to the predetermined residue number R to an adder 1A1 at a first stage. The multiplier 2M1 multiplies the data S1 from the delay circuit 11 by a first coefficient K1 and outputs a sum of a residue A1 of the product of $K1 \times S1$ with regard to the predetermined residue number R and the predetermined correction number u, that is, $A1+u$, to the adder 1A1. Further, the multiplier 2M2 multiplies the data S2 from the delay circuit 12 by a second coefficient K2 and outputs a sum of a residue A2 of the product of $K2 \times S2$ with regard to the predetermined residue number R and the predetermined correction number u, that is, $A2+u$, to the adder 1A2 at the second stage constituting an addition means set 1A2 and 1A3 and serving as the addition means at the first stage of the addition means set. Further, the multiplier 2M3 multipliers the data S3 from the delay circuit 13 by a third coefficient K3 and outputs a sum of a residue A3 of the product of $K3 \times S3$ with regard to the predetermined residue number R and the predetermined correction number u, that is, $A3+u$, to the adder 1A3 at the third stage.

The adder 1A1 adds A0 and $A1+u$ in binary notation and outputs first stage addition data B1 to the adder 1A2 and further outputs a first stage carry signal CA1 to an accumulation circuit 1A4 which serves as accumulation means. Further, the adder 1A2 adds B1 and $A2+u$ in binary notation and outputs second stage addition data B2 to the adder 1A3 and further outputs a second stage carry signal CA2 to the accumulation circuit 1A4. Furthermore, the adder 1A3 adds B2 and A3+u in binary notation and outputs third stage addition data B3 to a correction circuit 22 and further outputs a third stage carry signal CA3 to the accumulation circuit 1A4.

The accumulation circuit 1A4 cumulatively adds reversed values of the carry signals CA1, CA2 and CA3, that is, CA1, CA2 and CA3, in binary notation and outputs the cumulative sum as cumulative data Z to the correction circuit 22.

The correction circuit 22 outputs a difference of B3 from the product $u \times Z$ of the predetermined correction number u and the cumulative data Z, that is, $B3 - u \times Z = B4$.

Here, the multiplier 1M1 is of the type I; the multipliers 2M1, 2M2 and 2M3 are of the type II; the adders 1A1, 1A2, 1A3 and 1A4 are of the type I; and the adder 2A1 is of the type II (that is, a subtractor). Operation of the multipliers and the adders of the types just described can be recognized apparently from the description above.

In the arrangement shown in FIG. 1, while the multipliers 1M1, 2M1, 2M2 and 2M3 are constituted from lookup tables provided in a ROM, the adders 1A1, 1A2, 1A3, 1A4 and 2A1 can be constituted from binary adders, which is advantageous for increase of the calculation speed and reduction of the circuit scale of an integrated circuit comparing with the apparatus of the conventional construction wherein such adders are also constituted from lookup tables provided in a ROM. Further, the multiplier 22a multiplies the cumulative data Z by the predetermined correction number u which is a low value, and accordingly, it can be constituted from a binary adder and need not be constituted from a lookup table of a ROM.

Subsequently, operation of the circuit of FIG. 1 when concrete values are applied will be described. It is assumed that, in FIG. 1, A0=5, A1=25, A2=3 and A3=10, and the adders 1A1 to 1A4 are each formed from a 5-bit binary adder. Accordingly, the maximum value of a binary code of the adders 1A1 to 1A4 is 31. Here, when the predetermined residue number R is R=31, u=31+1−31=1. Further, it is assumed that the adder 2A1 is constituted from a 5-bit binary subtractor.

First, data to be inputted to the adder 1A1 are A0=5 and A1+u=26, and since A0+A1+u=31, the sum data B1 is B1=31. Further, the carry signal CA1 is CA1=0. Then at the adder 1A2, B1+A2+u=35, and accordingly, B2=3 and CA2=1. Further, at the adder 1AB, B2+A3+u=14, and accordingly, B3=14 and CA3=0.

Figure 5:
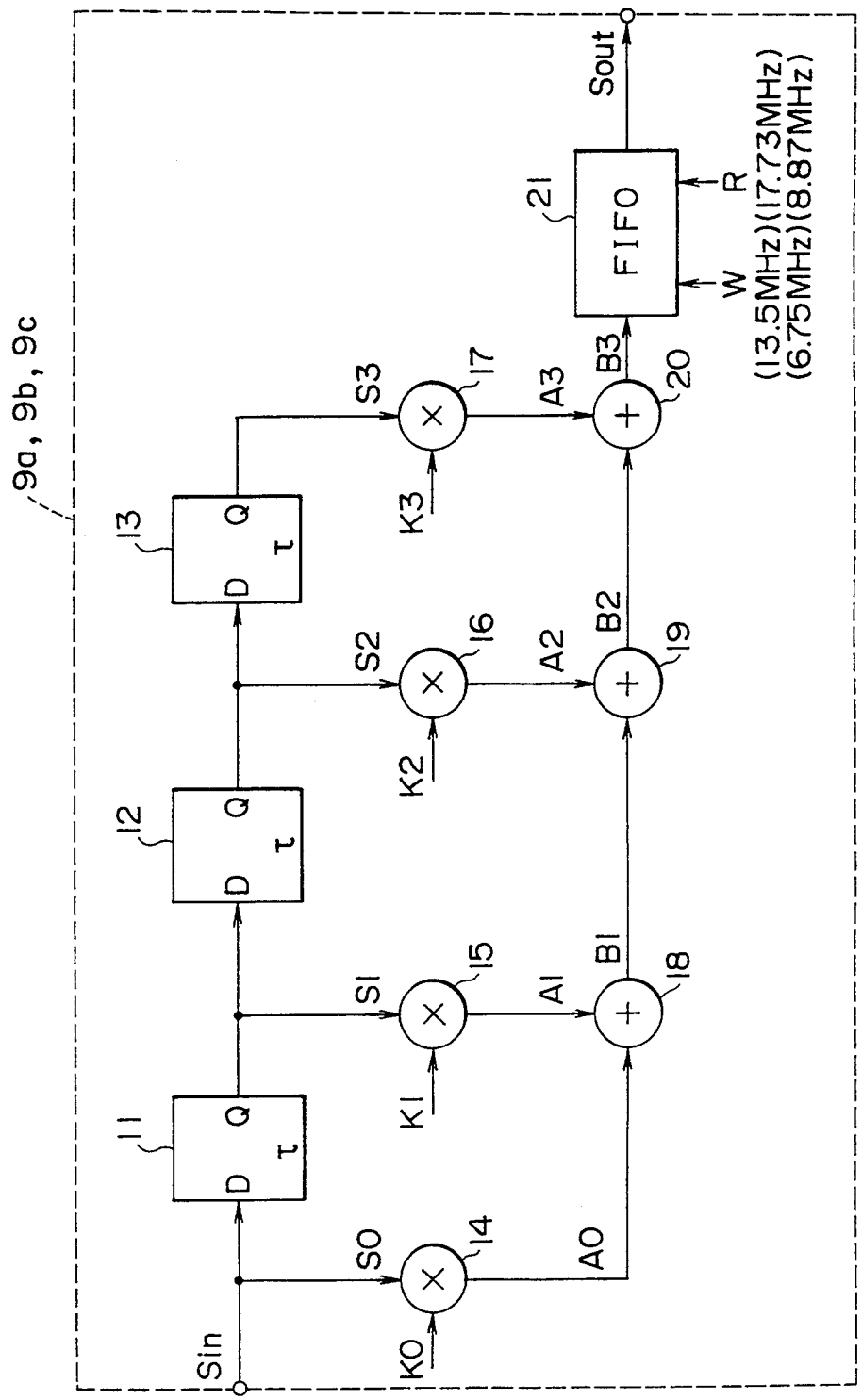
FIG. 5 is a block diagram showing a conventional residue calculation circuit.

At the accumulation circuit 1A4, Z=CA1+CA2+CA3=1+0+1=2. Accordingly, the output data B4 of the correction circuit 22 is given by B3−u×Z=14−2=12, and accordingly, B4=12. The value coincides with the value of the result obtained with the conventional circuit shown in FIG. 5. Further, A0+A1+A2+A3=43, and the residue of the value with regard to the residue number 31 is 12, which coincides with the value described above. Operation of a FIFO circuit 21 is similar to that in the conventional circuit of FIG. 5.

It is to be noted that, while the embodiment described above includes three delay circuits, the present invention can be applied similarly to another FIR filter which includes a greater number of delay circuits. For example, a delay circuit section may be constituted from a delay circuit set including n delay circuits while n multipliers of the type II and n adders of the type I are provided corresponding to the n delay circuits. In this instance, a multiplier set is constituted from n multipliers while an adder set is constituted from n-1 adders (since an adder at the first stage is excepted). In this manner, a FIR filter having an arbitrary number of stages can be constructed. In FIG. 1, the FIR filter having three stages, that is, n=3, is shown.

Figure 4:
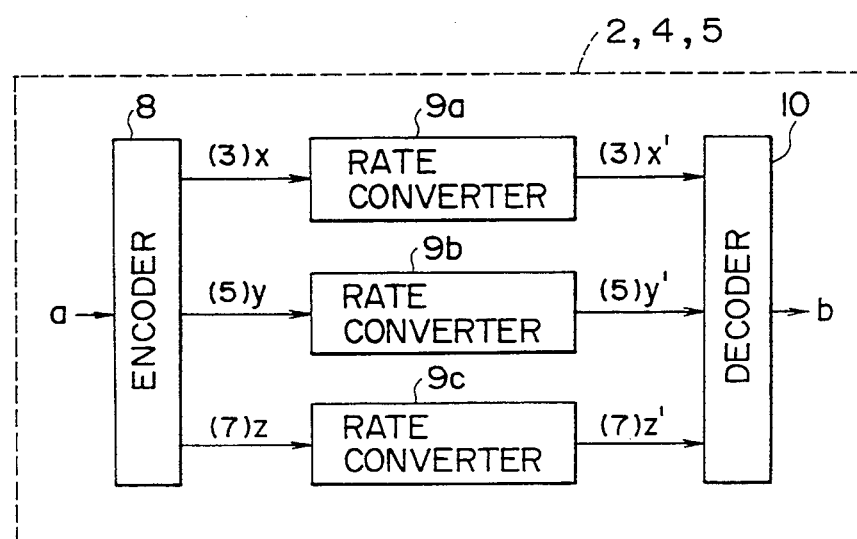
FIG. 4 is a block diagram of a rate conversion circuit employed in the rate conversion apparatus of FIG. 3.

Further, while the set of (3, 5, 7) is taken as residue numbers of the rate converter of FIG. 4, a different set such as, for example, (16, 15, 13, 11, 7) or (31, 29, 16, 15, 13) may be used alternatively. In the case of the set of (16, 15, 13, 11, 7), the dynamic range is 240,240 (which corresponds to 17.87 bits), and in the case of the set of (31, 29, 16, 15, 13), the dynamic range is 2,804,880 (which corresponds to 21.41 bits).

Having now fully described the invention, it will be apparent to one of ordinary skill in the art that many changes and modifications can be made thereto without departing from the spirit and scope of the invention as set forth herein.

What is claimed is:

1. A residue calculation circuit for calculating a residue for input residue data, comprising:

first through nth delay means connected in cascade for delaying input residue data supplied to said first delay means, each of said first through nth delay means delaying data supplied thereto and outputting respective delayed data;

means for multiplying said input residue data by a first coefficient to obtain a first product, for obtaining a residue of said first product with regard to a predetermined residue number and for supplying said residue of said first product as an output;

first through nth multiplication means for multiplying said delayed data of said first through nth delay means, respectively, by n respective coefficients to obtain n respective products, for obtaining a respective residue of each of said n respective products with regard to said predetermined residue number, and for adding a predetermined correction value to each of said respective residues to obtain n respective correction data;

first stage addition means for performing binary non-residue addition of said residue from said means for multiplying and said correction data from said first multiplication means to obtain first stage sum data, and for supplying as an output said first stage sum data and a first stage carry signal representing a presence or absence of a carry of said first stage addition means;

further addition means including second through nth stage addition means for respectively performing binary non-residue addition of said sum data output from a previous stage addition means and said respective correction data output from the second through nth of said multiplication means to obtain respective second through nth stage sum data, and for respectively supplying as an output said second through nth stage sum data and a second through nth stage carry signal representing a presence or absence of a carry of said respective second through nth stage addition means;

means for accumulating inverse values of said first through nth stage carry signals to obtain a cumulative carry value;

carry multiplying means for multiplying said cumulative carry value by said predetermined correction value to obtain a cumulative correction value; and means for subtracting said cumulative correction value from said nth stage sum data supplied from said nth stage addition means to obtain corrected data and supplying said corrected data as an output.

2. The residue calculation circuit of claim 1, wherein said carry multiplying means is a multiplier and said means for subtracting is a subtractor.

3. The residue calculation circuit of claim 1, wherein said first stage addition means and said second through nth stage addition means are all constituted by respective adders.

* * * * *